US006872953B1

(12) United States Patent
Benveniste

(10) Patent No.: US 6,872,953 B1
(45) Date of Patent: Mar. 29, 2005

(54) TWO DIMENSIONAL STATIONARY BEAM PROFILE AND ANGULAR MAPPING

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/850,298

(22) Filed: May 20, 2004

(51) Int. Cl.[7] .............................................. H01J 37/317
(52) U.S. Cl. .................................. 250/397; 250/492.21
(58) Field of Search ............................. 250/397, 492.21

(56) References Cited

U.S. PATENT DOCUMENTS

| | | | |
|---|---|---|---|
| 3,989,946 A | * 11/1976 | Chapman et al. | ........... 250/332 |
| 5,198,676 A | 3/1993 | Benveniste et al. | |
| 5,218,210 A | 6/1993 | McIntyre, Jr. et al. | |
| 6,677,598 B1 | 1/2004 | Benveniste | |

* cited by examiner

Primary Examiner—Kiet T. Nguyen
(74) Attorney, Agent, or Firm—Eschweiler & Associates LLC

(57) ABSTRACT

An ion beam uniformity detector of the present invention includes a number of horizontal rods and a number of vertical rods placed on parallel planes and separated by a selected distance. Crossover measurement points are defined by intersections of the horizontal and vertical rods. By selectively and sequentially applying a pulse to the vertical rods and concurrently biasing horizontal rods, measurements can be obtained for the crossover measurement points, which can then be employed to determine ion beam shape and ion beam intensity at the crossover measurement points. Based on these measurements, adjustments can be made to a continuing ion implantation process in order to increase uniformity with respect to intensity as well as to provide a desired beam shape. Additionally, pairs of vertical and horizontal rods can be employed to also obtain measurements that indicate angle of incidence in two dimensions at the various crossover points.

20 Claims, 13 Drawing Sheets

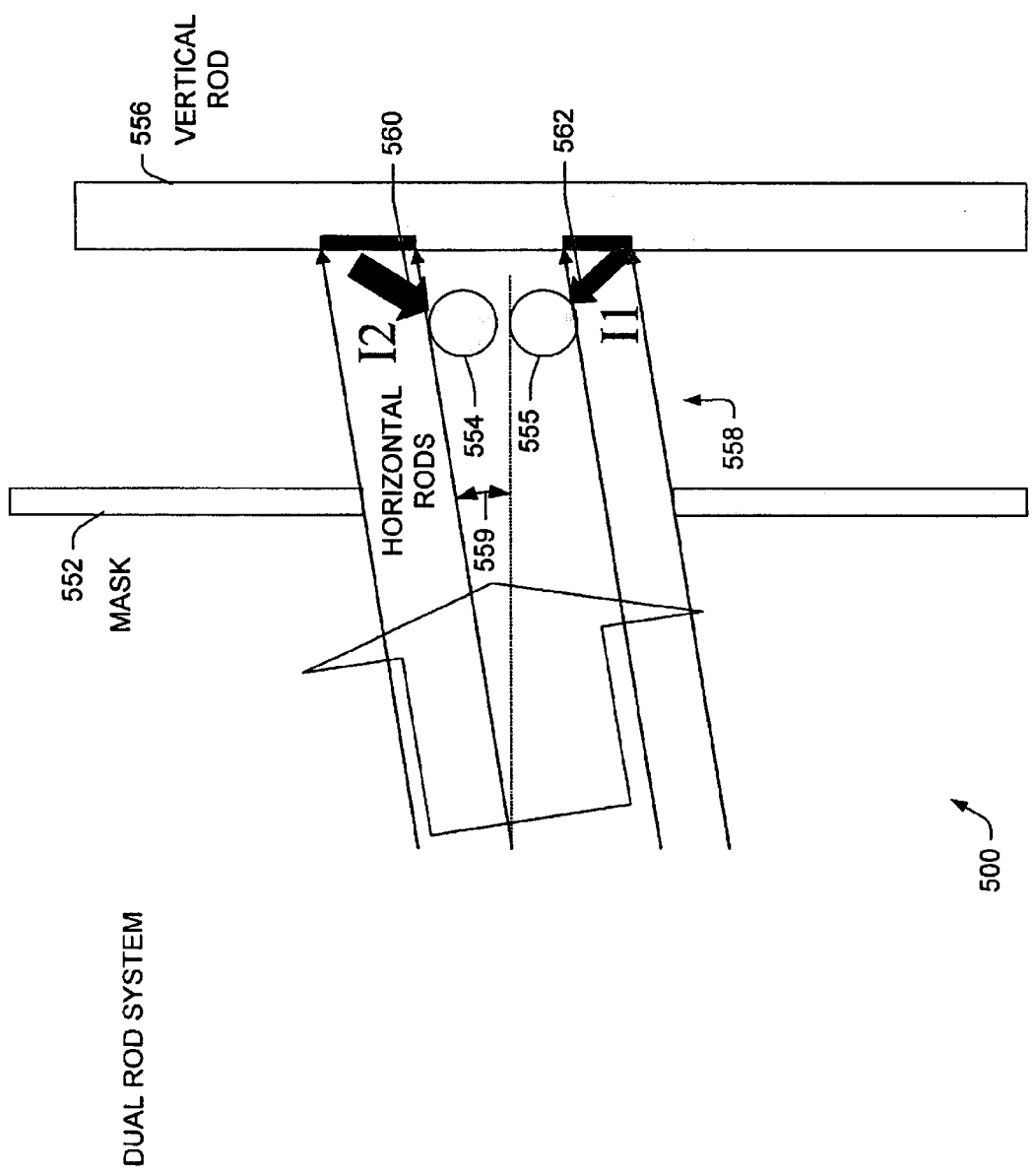

$Vo \approx Iin * R / r * \int Iin \cdot dt$

TWO DIMENSIONAL STATIONARY BEAM PROFILE AND ANGULAR MAPPING

REFERENCE TO RELATED APPLICATIONS

This application is related to U.S. patent application Ser. No. 10/425,924, now issued as U.S. Pat. No. 6,677,598, filed Apr. 29, 2003, issued Jan. 13, 2004, and entitled "BEAM UNIFORMITY AND ANGULAR DISTRIBUTION MEASUREMENT SYSTEM".

FIELD OF INVENTION

The present invention relates generally to ion implantation devices, and, more particularly, to two dimensional beam profile and angular mapping systems and methods.

BACKGROUND OF THE INVENTION

Ion implantation is a physical process, as opposed to diffusion, which is a chemical process, employed in semiconductor device fabrication to selectively implant dopant into semiconductor and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a wafer. The dopant ions physically bombard the wafer, enter the surface and come to rest below the surface.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system, referred to as a linear accelerator, is employed in some instances to accelerate or decelerate the desired dopant ions to a predetermined momentum (e.g., mass of an dopant ion multiplied by its velocity) to penetrate the wafer surface. For acceleration, the system is generally of a linear design with annular powered electrodes and pairs of quadruple lenses along its axis. The quadruple lenses are powered by negative and positive electrical potentials. As the dopant ions enter therein, they are accelerated therethrough by the powered electrodes and are (as a beam) selectively focused and defocused by the quadruple lenses.

Continuing on, the dopant ions are then directed towards a target wafer at an end station. The dopant ions, as a beam, impact the wafer with a beam intensity, which is a measure of the number of particles per unit time as a function of position, and emittance, which is an angular distribution (angle of incidence) of the beam as a function of position. Generally, it is desirable that the beam intensity and emittance be substantially uniform and at expected or desired values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by monitoring uniformity of an ion beam with respect to intensity and/or emittance, which are significant in determining and providing uniformity in ion implantation. This uniformity can be obtained relatively quickly at adequate space resolution to allow for subsequent manipulation to achieve a relatively uniform ion implantation.

A uniformity detector of the present invention includes a number of horizontal rods and a number of vertical rods placed on parallel planes and separated by a selected distance. Crossover measurement points are defined by intersections of the horizontal and vertical rods. By selectively and sequentially applying a negative pulse to the vertical rods and concurrently biasing the horizontal rods, measurements can be obtained for the crossover measurement points, which are then employed to determine beam density at the crossover measurement points. Based on these measurements, adjustments can be made to a continuing ion implantation process in order to increase uniformity with respect to intensity Another uniformity detector of the present invention includes a number of pairs of horizontal rods and a number of pairs of vertical rods placed on parallel planes and separated by a selected distance. Crossover measurement points are defined by intersections of the pairs of horizontal and the pairs of vertical rods. By selectively and sequentially applying a negative pulse to the pairs of vertical rods and concurrently biasing the pairs of horizontal rods, measurements are obtained for the crossover measurement points, which are then employed to determine, ion beam density, and angle of incidence values at the crossover measurement points. Based on these measurements, adjustments can be made to a continuing ion implantation process in order to increase uniformity with respect to emittance and intensity as well as to provide a desired beam shape.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 6A is a cross sectional view of a dual rod pair of the uniformity detector of FIG. 5 along a vertical rod in accordance with an aspect of the present invention.

DETAILED DESCRIPTION OF THE INVENTION

Figure 1:
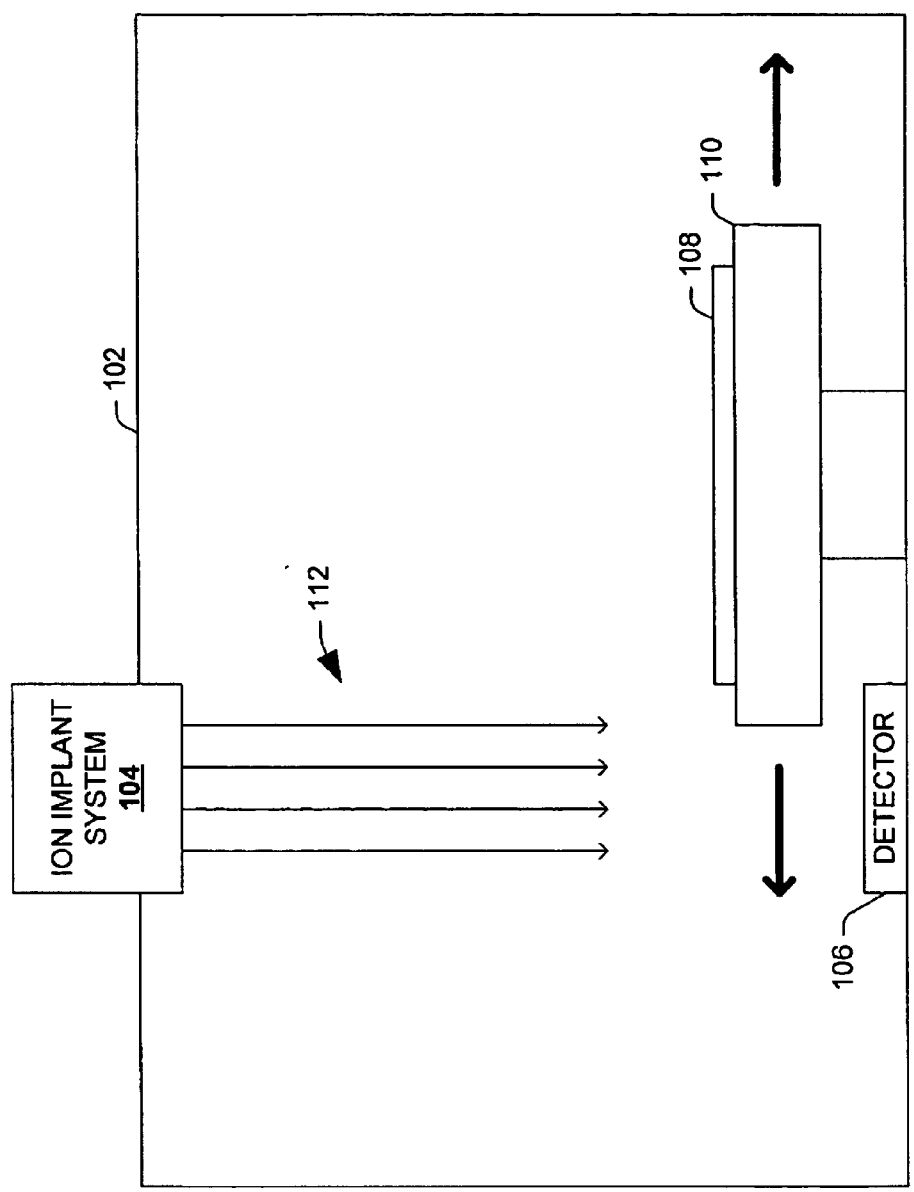
FIG. 1 is a block diagram illustrating a single wafer ion implantation system in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

Ion beam profile and angular content are significant in determining the uniformity of ion implantation and performing adjustments to increase uniformity during ion implantation processes. One characteristic of uniformity is ion beam intensity, which is a measure of the number of particles per unit time at a given location of an ion beam cross section. Another characteristic of uniformity is ion beam emittance, which is the angular distribution of the beam as a function of position within the beam. An ion beam profile is a measure of ion beam intensity across a beam in one or two dimensions.

In certain classes of ion implanters (e.g., serial ion implanters), the target wafer remains stationary and the ion beam is scanned across the wafer surface. Other classes of ion implanters, referred to as batch ion implanters, employ a spinning disk or platen on which are affixed a number of wafers that are rotated through an incident ion beam. For both classes, beam uniformity is significant to achieving desired, uniform ion implantations.

Some conventional ion implantation systems employ a spinning disk profiler or a linear array to measure beam characteristics during ion implantation. The spinning disk profiler employs a spinning disk and measures beam intensity in a spiral hole pattern. However, the spinning disk profiler has only a limited resolution, requires a spinning disk and associated spinning mechanism, and has a relatively slow acquisition of data. The linear array employs a mechanical scan and is relatively slow, requires a relatively large amount of space and can negatively impact reliability of ion implantation process. Additionally, the linear array is limited to a single dimension, and thus fails to provide a two dimensional mapping.

Ion beam profile and angular content are important in determining the uniformity of ion implantations, particularly in serial implanters where different parts of a target wafer are implanted by different parts of a beam. It may be necessary to manipulate angular content and profile during ion implantation in order to obtain a substantially uniform implant across a target wafer. After such manipulations, beam distributions are measured to modify current ion implantations and to guide future ion implantations.

The present invention facilitates semiconductor device fabrication by monitoring uniformity of an ion beam with respect to intensity and/or emittance, which are significant in determining and providing uniformity in ion implantation. This uniformity can be obtained relatively quickly at adequate space resolution to allow for subsequent manipulation of an ion beam to achieve a relatively uniform ion implantation. The measurements can be provided before ion implantation (e.g., calibration), during ion implantation (e.g., in situ), or after ion implantation (e.g., verification). Based on the uniformity measurements, an ion beam is adjusted in real time to improve uniformity. As a result, ion implantation is performed with an improved uniformity and under tighter process controls.

Beginning with FIG. 1, a block diagram of a simplified exemplary serial wafer ion implantation system 100 in accordance with an aspect of the present invention is illustrated. The system 100 includes a chamber 102, an ion implantation system 104 including a source, a uniformity detector 106, and a module 110, also referred to as a pedestal or end station, that holds a single wafer 108. The system 100 depicted in FIG. 1 is provided for illustrative purposes and is not intended to include all aspects, components, and features of an ion implantation system. Instead, the system 100 is depicted so as to facilitate a further understanding of the present invention.

The ion implantation system 104 generates an ion beam 112, typically a ribbon beam or, scanned pencil beam, having a number of characteristics including, shape, dopant type, dose, beam current, intensity, emittance, angle of incidence, energy, and the like. Although the ion beam 112 is depicted as being substantially orthogonal to a surface of the wafer 108, the ion beam 112 can be at other incident angles with the surface of the wafer 108 (e.g., θ>0, where 0 is a beam perpendicular to the surface).

As stated above, the module 110 holds the wafer 108, for example, via a mechanical or electrostatic clamp. Additionally, the module 110 is operable to move the wafer (as indicated) through the ion beam 112 at a controlled rate so as to achieve desired implantation results. In an alternate aspect, the ion beam 112 is moved across the wafer in a single pass or multiple passes. Generally, a given ion implantation is performed in a single pass of the wafer 108 through the ion beam 112. By so doing, a substantially uniform implantation across the wafer 108 can be obtained because all parts or portions of the wafer 108 move through the ion beam 112 at about the same rate. In contrast, other ion implantation systems employ a process disk that may also incorporate the present invention.

The uniformity detector 106 in the present example is positioned below the module 110 and in-line with the ion beam 112. The detector 106 is shown in a stationary position. It is appreciated that alternate aspects of the invention include any suitable number of detectors, detectors located at other positions, and movable detectors. For example, the detector 106 may be integrated on to the module or pedestal 110 and be in substantially the same plane as the wafer 108. The detector 106 measures uniformity of beam current across the ion beam 112 at a number of locations, which also indicates a shape of the ion beam 112. Additionally, the detector 106 obtains angle of incidence measurements of the ion beam 112 at a number of locations in two dimensions. The beam current uniformity and angle of incidence measurements are employed to modify the ion beam 112 generated by the ion implantation system 104 so as to improve uniformity. Additionally, these measurements can be used to indicate damage to wafers when the measurements depict substantial deviations.

The detector 106 includes a series of elements that respectively include an aperture and a crossover point. The aperture permits only a portion of the ion beam 112, referred to as a beamlet, to pass through to the crossover point. Beam current measured by each of the sensors is employed to indicate an angle of incidence of the beamlet and, therefore, a portion of the ion beam 112. Accordingly, each of the crossover points can be utilized to obtain an angle of incidence measurement and the measurements of the elements are then used to determine uniformity of the angle of incidence throughout the ion beam 112. Further details and examples of suitable detectors in accordance with the present invention are described infra.

Figure 2:
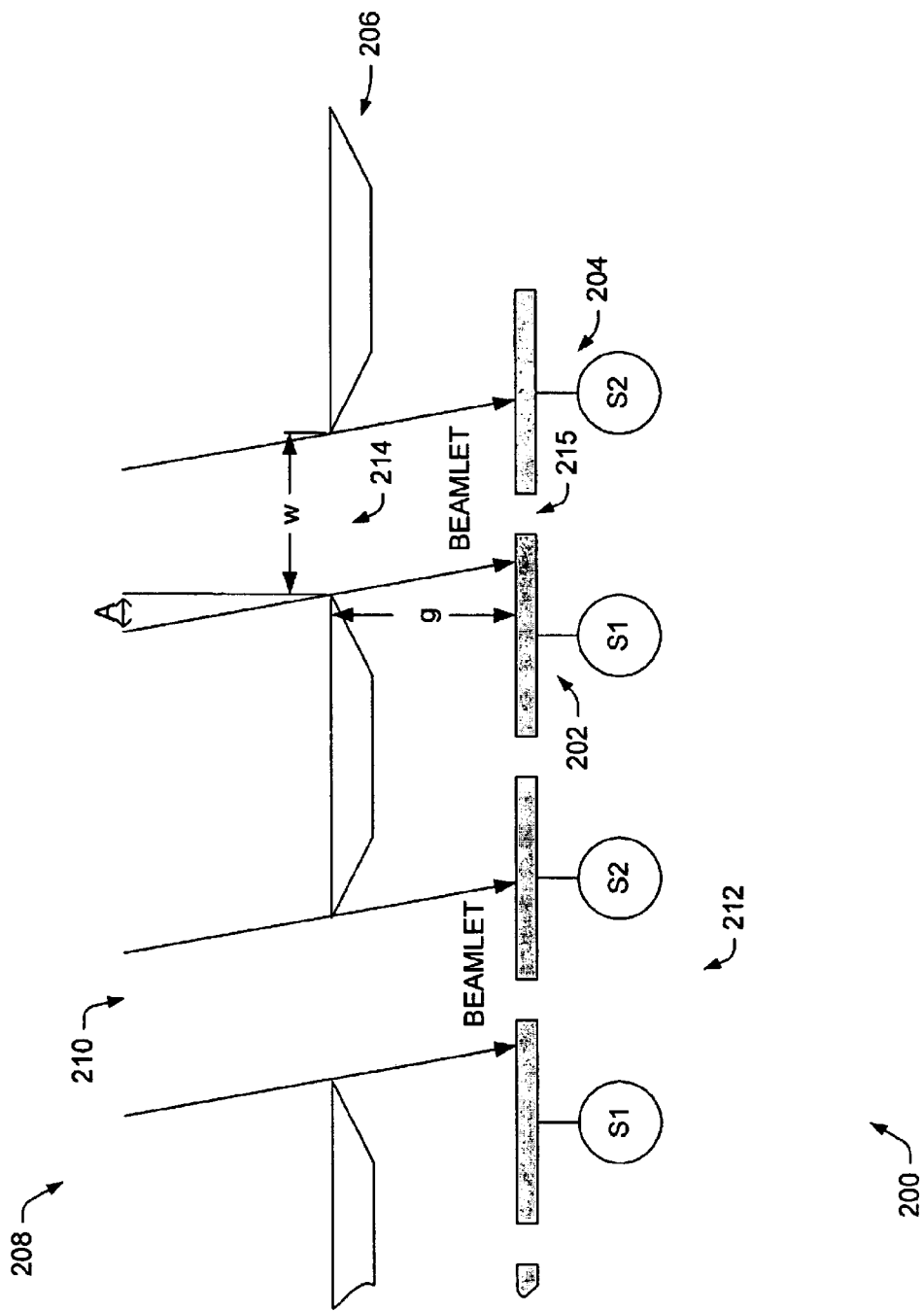
FIG. 2 is a diagram illustrating a portion of a single dimension uniformity detector.

Turning now to FIG. 2, a cross-section diagram of a portion of a single dimension detector 200 is illustrated. This cross-section is uniform along the orthogonal dimension, over a length that covers one maximum dimension of the beam to be mapped. The detector 200 is comprised of a mask 206 and a series of sensor pairs 212 (S1 and S2), defining a number of elements, which are operable to obtain angle of incidence measurements in a first direction and beam uniformity measurements. The uniformity detector 200 can obtain these uniformity measurements at various portions of an ion beam 208 so as to indicate uniformity of the ion beam with respect to beam current and angle of incidence in a single dimension.

Individual elements are comprised of a slit aperture 214, a first beam current sensor 202, and a second beam current sensor 204. The aperture 214 is defined by the mask 206 and obtains a beamlet 210 from the ion beam 208 according to a width w of the aperture 214. The first beam current sensor 202 and the second beam current sensor 204 are positioned symmetrically below the aperture 214 a distance g and are separated from each other by a gap 215. The sensors (202 and 204) obtain beam current measurements (first and second measurements) from the beamlet 210. Because of their positioning, the first sensor 202 and the second sensor 204 measure different amounts of beam current depending on the angle of incidence of the beamlet 210 and the ion beam 208. As an example, the beamlet 210 depicted in FIG. 2 would yield a greater measured beam current by the second sensor 204 as compared with the first sensor 202. It is noted that if the angle of incidence A is about zero (e.g., a beam substantially perpendicular to the detector), the measured beam current of the sensors (202 and 204) is about equal.

The angle of incidence A of the beamlet 210 is a function of the first measurement and the second measurement. A suitable formula that can be used in accordance with the present invention to determine the angle of incidence A is as follows:

$$A=((S1-S2)/(S1+S2))*w/2g \quad \text{(Eq. 1)}$$

where A is the angle of incidence, S1 is the first measured beam current, S2 is the second measured beam current, w is the width of the aperture, and g is the distance the sensors are located below the mask 206 or aperture 214. Other suitable formulas can be employed to obtain the angle of incidence and/or an indication of the angle of incidence and still be in accordance with the present invention. Furthermore, the first measured beam current and the second measured beam current can be added together (S1+S2) to provide an indication of beam current at the element in a single dimension, averaged along the other dimension.

The detector 200 is only able to obtain an angle of incidence for a single dimension, averaged along the orthogonal dimension. As a result, other similar detectors can be employed and aligned orthogonal to the detector 200 in order to obtain average angle of incidence measurements in a second direction.

If M is the number of slits and sensor pairs in one dimension, and N the number of slits and sensor pairs in the other dimension, the detector produces an intensity profiles of M and N values, and angular profiles of M and N values.

In contrast, the detector described in the present invention, measures intensity and angles at each point (not averaged over a dimension), producing an intensity profile map of N×M values, and and angular profile of M×N values, thus characterizing more accurately these properties.

Figure 3:
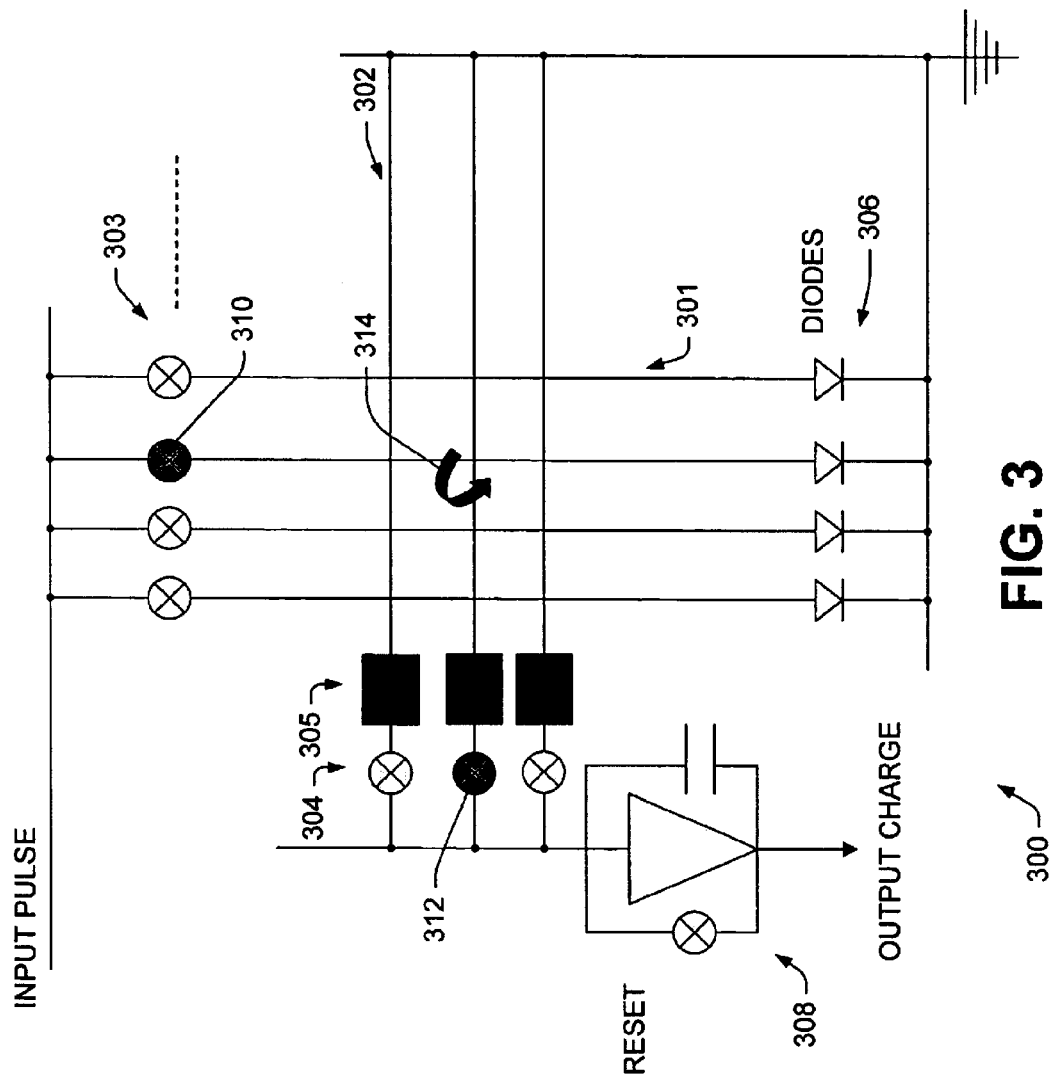
FIG. 3 is a diagram illustrating a uniformity detector in accordance with an aspect of the present invention.

FIG. 3 is a diagram that illustrates a uniformity detector 300 in accordance with an aspect of the present invention. The detector 300 is operable to characterize an ion beam with respect to beam intensity and shape. Additionally, the detector 300 can be employed as a diagnostic tool in beamlines under development, where ion optical elements are evaluated. Generally, a mask (not shown) positioned above the detector and having one or more defined apertures selectively permits portions of an incident ion beam, referred to as beamlets, to impact the sensor 300. A further description of a suitable mask is provided infra.

The uniformity detector 300 includes a number of vertical rods 301 and a number of horizontal rods 302. The vertical rods 301 are positioned further downstream (or behind) of an incident ion beam than the horizontal rods 302. Intersections of these rods (301 and 302) define crossover points. The vertical rods 301 are connected to and receive an input pulse by way of horizontal multiplexer switches 303 and also connected to ground through a number of diodes 306, respectively. The input pulse provides a negative bias of the vertical rods 301 to the horizontal rods 302, when selected. The horizontal rods 302 are connected to a charge collection circuit 308 by way of a number of horizontal multiplexer switches 304 and ground. A number of high pass filters 305, described in detail later, are interposed on the horizontal rods 302 before the horizontal multiplexer switches 304 in order to mitigate cross rod interference (e.g., impact of DC bias from one rod to another). The charge collection circuit 308 is connected to the horizontal multiplexer switches 304 and provides an output charge that is indicative of beam intensity for a particular crossover point.

The following provides some exemplary dimensions for components of the uniformity detector 300. The horizontal 302 and vertical rods 301 are comprised of a conductive material and have a relatively small diameter (e.g., about 1 mm). Spacing between horizontal rods 302 and spacing between vertical rods 301 is also relatively small (e.g., about 5.0 mm). The mask has apertures of a suitable rectangular dimension (e.g., 3×3 mm square) and is at a suitable distance (e.g., 2.5 mm) from the crossover points. It is appreciated that the present invention contemplates other suitable dimensions for the components of the uniformity detector 300.

Typically, the dimensions for the components of the uniformity detector are chosen according to required spacial resolution, required angular resolution, and required angular range. Generally, smaller diameter rods 301 and 302 are employed for high density grids and resolutions (e.g., higher spacial resolutions). Larger spacing between vertical 301 and horizontal 302 rods and a larger distance from crossover points to mask, provide high angular resolution, but low angular range, and criticality of alignment. In contrast, larger diameter rods may accommodate lower density resolution, but require smaller spacing between vertical 301 and horizontal 302 rods and a smaller distance from crossover points to the mask, but accommodate a wider angular range and are less sensitive to alignment. As a result, the dimensions are chosen according to anticipated ion beam properties and objectives of ion implantation.

During operation, a single vertical rod 301 and a single horizontal rod 302 are selected and connected at a time in order to obtain a measurement sample at an associated crossover point. For example, a vertical multiplexer switch 310 for a vertical rod is turned on, thereby connecting the vertical rod to the input pulse. Additionally, a horizontal multiplexer switch 312 is turned on and a measurement of charge for a current crossover point 314 can be obtained. Secondary electron emissions that are generated at the current crossover point 314 due to an incident ion beam are driven by the input voltage pulse applied to the vertical rod, into the adjacent horizontal rod 404. These secondary electron emissions result in a measured output charge by the amplifier charge circuit 308 that is indicative of beam intensity at the crossover point 314. Generally, the output charge is proportional to the current density at that crossover point. If the measured output charge is about zero, then it can be assumed that the incident ion beam does not impact that particular crossover point 314.

Figure 4:
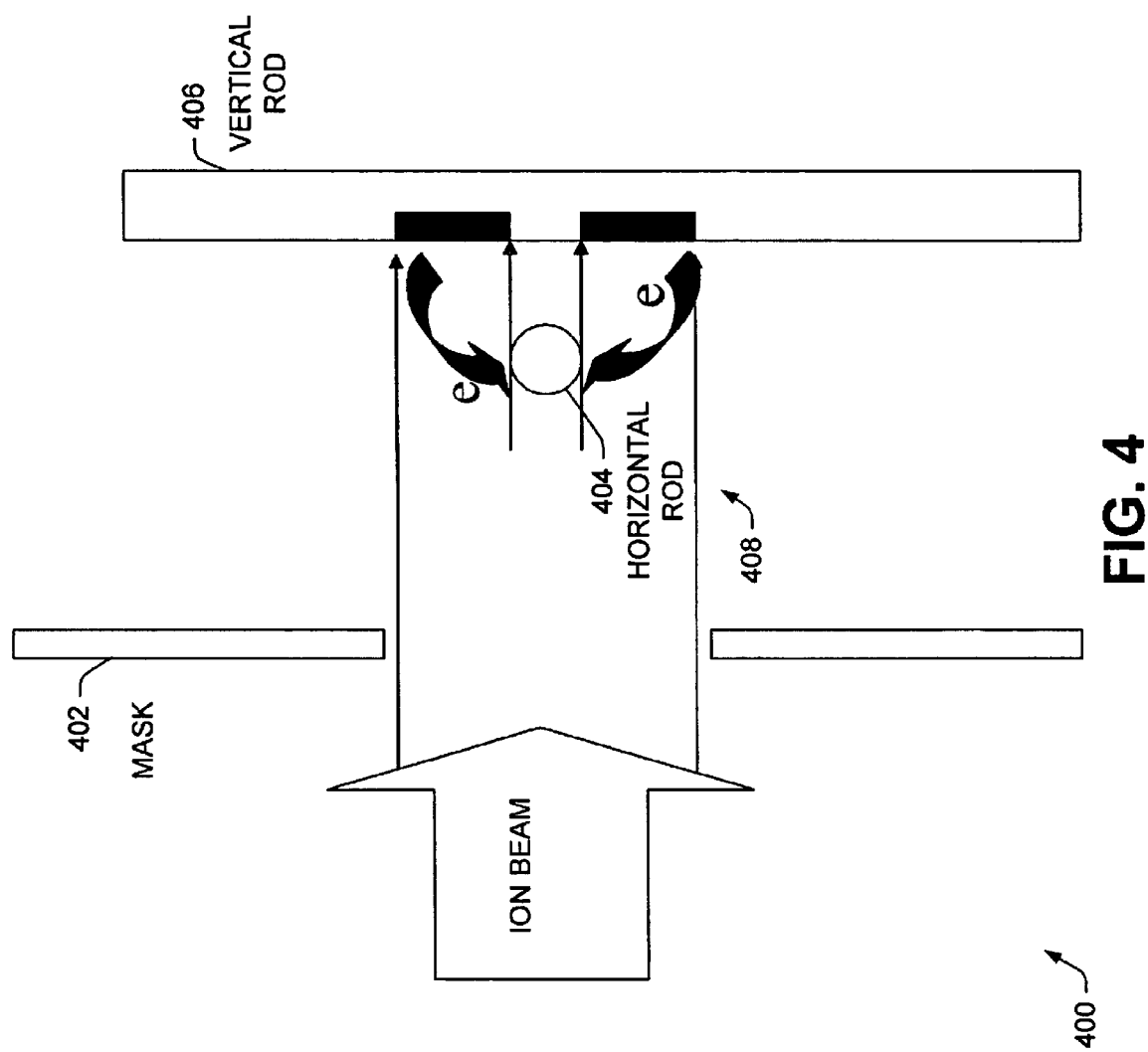
FIG. 4 is a cross sectional view of a single rod pair of a uniformity detector in accordance with another aspect of the present invention.

FIG. 4 is a cross sectional view illustrating a single rod uniformity detector 400 in accordance with another aspect of the present invention. The view includes only a portion of the detector 400, which includes other horizontal rods, vertical rods, and the like such as shown in FIG. 3. Here, the view includes a mask 402 that permits a portion 408 of an incident ion beam to pass therethrough. The portion permitted to pass is also referred to as a beamlet 408.

A horizontal rod 404 is present as well as a vertical rod 406, which is downstream and orthogonal to the horizontal rod 404. The vertical rod 406 and the horizontal rod 404 are currently selected via appropriate switches (not shown) to measure an output charge for an associated crossover point. In this aspect, the horizontal rod 404 is pulsed with a positive pulse and the vertical rod 406 is biased to a negative or ground value. As a result, the beamlet 408 impacts the horizontal rod 404 and the vertical rod 406 causing secondary electron emissions to be generated and collected by the positively pulsed horizontal rod 404. These emissions are measured as a charge output value for the associated crossover point and the charge output is relative to or a function of beam intensity at the associated crossover point.

Figure 5:
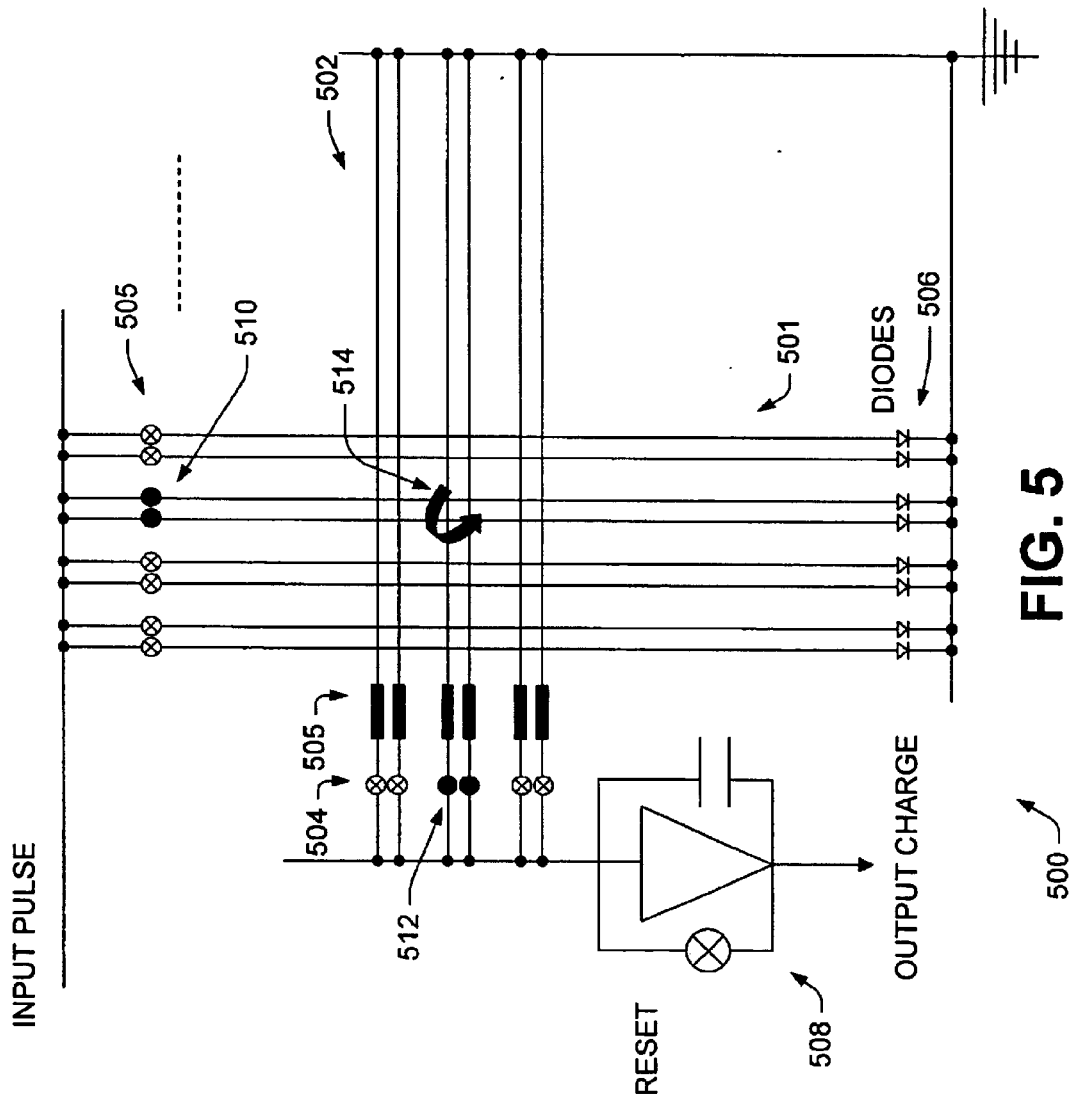
FIG. 5 is a diagram that illustrates a dual rod uniformity detector in accordance with an aspect of the present invention.

FIG. 5 is a diagram that illustrates a dual rod uniformity detector 500 in accordance with another aspect of the present invention. The detector 500 is operable to characterize an ion beam with respect to beam intensity and shape. Additionally, the detector 500 can be employed as a diagnostic tool in beamlines under development, where ion optical elements are evaluated. Generally, a mask having a defined aperture selectively permits portions of an incident ion beam to impact the sensor 500.

The uniformity detector 500 includes pairs of vertical rods 501 and pairs of horizontal rods 502. The vertical pairs 501 are further downstream (or behind) of an incident ion beam than the horizontal pairs 502. Intersections of these pairs of rods (501 and 502) define crossover points, which is where a pair of vertical rods intersects a pair of horizontal rods. The vertical pairs 501 are connected to and receive an input pulse by way of horizontal multiplex switches 503 and to ground by way of a number of diodes 506. The input pulse provides a negative bias. The horizontal pairs 502 are connected to a charge collection circuit 508 by way of a number of horizontal multiplexer switches 504 and are also connected to ground. A number of high pass filters 505, described in detail later, are interposed on the horizontal pairs 502 before the horizontal multiplexer switches 504 in order to mitigate cross rod interference (e.g., impact of DC bias from one rod to another). The charge circuit 508 is connected to the horizontal multiplexer switches 504 and provides an output charge that is indicative of beam intensity for a particular crossover point.

The following provides some exemplary dimensions for components of the uniformity detector 500. The horizontal 502 and vertical pairs 501 are comprised of a conductive, material and have a relatively small diameter (e.g., about 1 mm). Spacing between horizontal pairs 502 and spacing between vertical pairs 501 is also relatively small (e.g., about 5.0 mm). Spacing between rods of horizontal and vertical pairs (501 and 502) is a suitable value (e.g., about 2.5 mm). The mask has apertures of a suitable rectangular dimension (e.g., 3×3 mm square) and is at a suitable distance (e.g., 2.5 mm) from the crossover points. It is appreciated that the present invention contemplates other suitable dimensions for the components of the uniformity detector 500.

Typically, the dimensions for the components of the uniformity detector are chosen according to required spacial resolution, required angular resolution, and required angular range. Generally, smaller diameter rods 501 and 502 are employed for high density grids and resolutions (e.g., higher spacial resolutions). Smaller diameter rods, larger spacing between vertical 501 and horizontal 502 pairs, larger spacing between rods, and a larger distance from crossover points to mask, and provide high angular resolution, but low angular range, and criticality of alignment. In contrast, larger diameter rods may accommodate lower density resolution, but require smaller spacing between vertical 501 and horizontal 502 rods and a smaller distance from crossover points to the mask, but accommodate a wider angular range and are less sensitive to alignment. As a result, the dimensions are chosen according to anticipated ion beam properties and objectives of ion implantation.

During operation, a single pair of vertical rods and a single pair of horizontal rods are selected and connected at a time in order to obtain a measurement sample at an associated crossover point. For example, vertical multiplexer switches 510 for a vertical rod pair are turned on and connect the pair to the input pulse. Additionally, horizontal multiplexer switches 512 are turned on and a measurement of charge for a current crossover point 514 can be obtained. Secondary electron emissions are generated at the current crossover point 514 due to an incident ion beam. The input voltage pulse applied to the vertical rods, drive that current onto the adjacent horizontal rods. These secondary electron emissions are collected and result in a measured output charge(s) by the charge circuit 508 that is indicative of beam intensity at the crossover point 514. Generally, the greater the beam intensity at the crossover point 514, the greater the measured output charge. If the measured output charge is about zero, then it can be assumed that the incident ion beam does not impact the crossover point 514. Additionally, the measured charges indicate an angle of incidence value for the incident ion beam. Further details on obtaining the angle of incidence value are provided below.

FIG. 6A is a cross sectional view of the dual rod uniformity detector 500 of FIG. 5 along a vertical rod in accordance with an aspect of the present invention. This view is presented to further illustrate how to obtain an angle of incidence measurement in a vertical dimension.

The view presented in FIG. 6A includes a mask 552 that includes an aperture with a selected dimension to permit a portion 558 of an incident ion beam to pass. The portion permitted to pass is also referred to as a beamlet 558.

The view depicts a single vertical rod 556 and a first 554 and second 555 horizontal rods, which operate as a pair of horizontal rods. The single vertical rod 556 and a second vertical rod (not shown) operate as a pair of vertical rods. The mask 552 permits only the selected beamlet 558 to pass through the mask 552 and impact the rods (554, 555, and 556). The beamlet 558 strikes portions of the first horizontal rod 554, the second horizontal rod 555, and the vertical rod 556. As a result, secondary emission currents are generated from regions 560 and 562. However, different amounts of emissions are generated due to the angle of incidence 559 of the beamlet 558, and the combined shadow of the horizontal rods 554,555, relative to the aperture in the mask. First and second charge output values are measured for each of the horizontal rods (554 and 555), which can then be employed to obtain the angle of incidence 559. Generally, the angle of incidence 559 is proportional to the difference between the first and second charge output values. Additionally, the first and second charge output values are indicative of beam intensity at the crossover point, as described above.

Figure 6B:
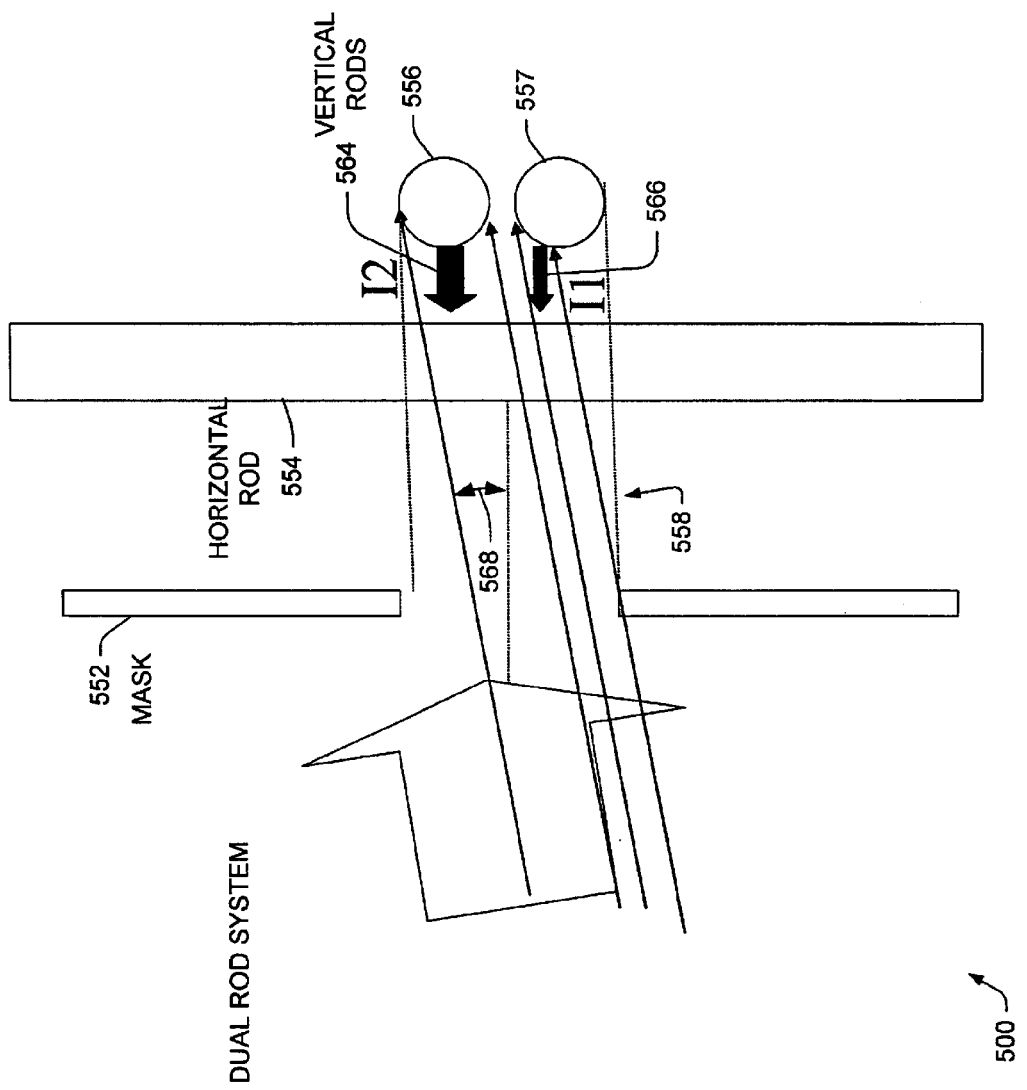
FIG. 6B is a cross sectional view of the dual rod uniformity detector of FIG. 5 along a horizontal rod in accordance with an aspect of the present invention.

FIG. 6B is another cross sectional view of the dual rod uniformity detector 500 of FIG. 5 along a horizontal rod in accordance with an aspect of the present invention. This view is presented to further illustrate how to obtain an angle of incidence measurement in a horizontal dimension.

The view presented in FIG. 6B includes a mask 552 that includes an aperture with a: selected dimension to permit a portion 558 of an incident ion beam to pass. The portion permitted to pass is also referred to as a beamlet 558.

The view depicts a single horizontal rod 554 and first 556 and second 557 vertical rods, which operate as a pair of vertical rods. The mask 552 permits only the selected beamlet 558 to pass through the mask 552 and impact the rods (554, 555, and 556). The beamlet 558 strikes portions of the horizontal rod 554, the first vertical rod 556, and the second vertical rod 557. As a result, first 564 and second 566 secondary electron emissions are generated. However, different amounts of emissions are generated due to the angle of incidence 558 of the beamlet 558 and, therefore the incident ion beam. First and second charge output values are measured for the horizontal rod 554 according to a first pulse for the first vertical rod 556 and a second pulse for the second vertical rod 557, which can then be employed to obtain the angle of incidence 568. Generally, the angle of incidence 558 is proportional to the difference between the first and second charge output values. Additionally, the first and second charge output values are indicative of beam intensity at the crossover point, as described above.

Figure 7:
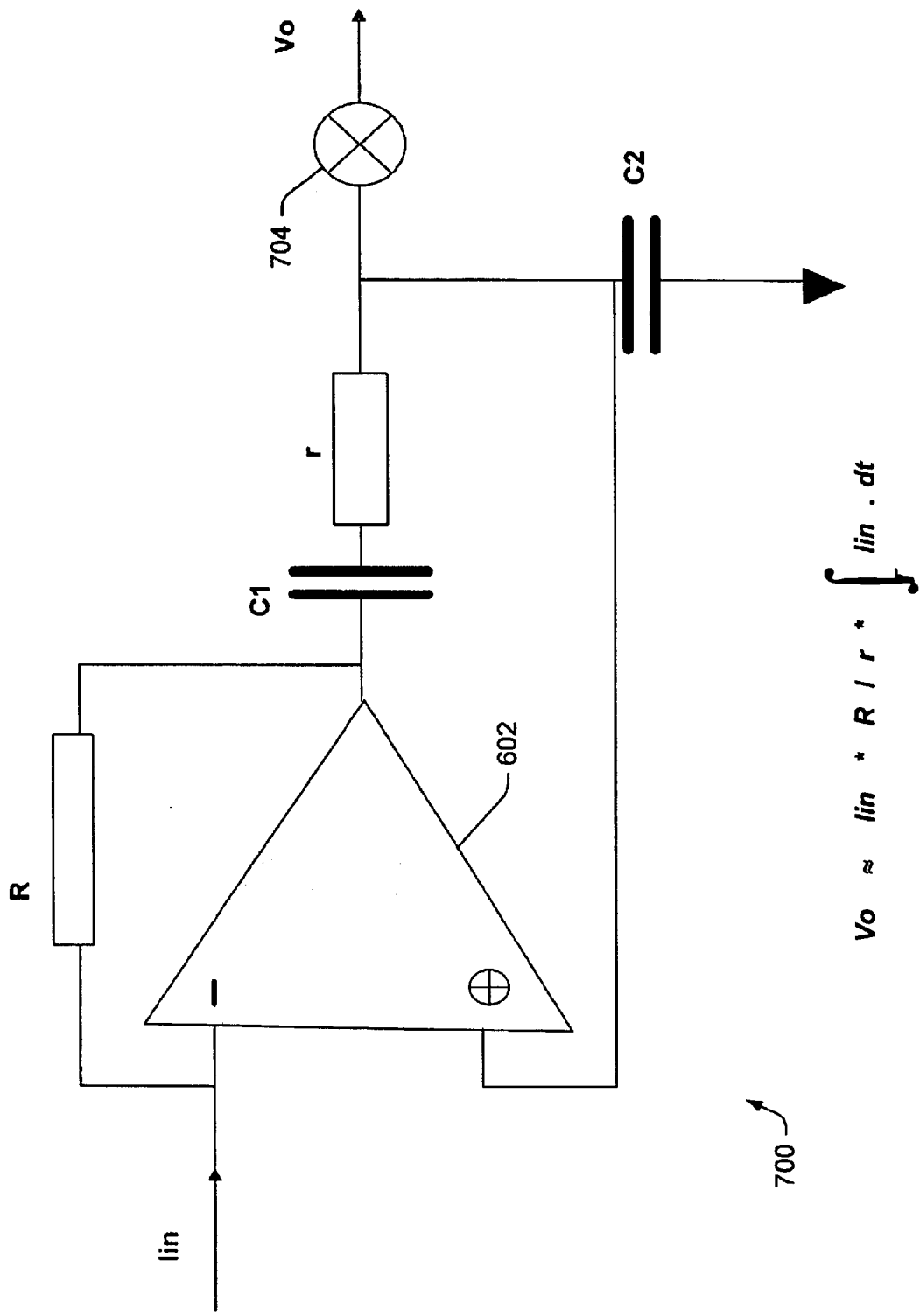
FIG. 7 is a diagram illustrating a high pass integrator in accordance with an aspect of the present invention.

FIG. 7 is a diagram illustrating a high pass integrator 700 in accordance with an aspect of the present invention. Typically, high pass integrators are present in detectors of the present invention and there is a high pass integrator for each vertical rod connected to respective horizontal multiplex switches that link to a charge output circuit. The high pass integrator 700 can be employed as high pass filters in uniformity detectors of the present invention, such as, for example the high pass filters 305 of FIG. 3 and the high pass filters 505 of FIG. 5.

Input current (Iin), current flowing across a currently selected crossover point, is integrated by the high pass integrator to produce a voltage output (Vo). The integrator 700 receives the input current at a negative terminal of a differential amplifier 702. A first resistor (R) is present and connects the negative input terminal to an output terminal of the differential amplifier 602. A first terminal of a first capacitor (C1) is also connected to the output terminal of the differential amplifier 702. A second resistor (r) has a first terminal connected to a second terminal of the first capacitor (C1) and a second terminal connected to a horizontal multiplex switch 704 and a positive input terminal of the differential amplifier 702. A first terminal of a second capacitor (C2) is also connected to the positive input terminal and a second terminal is connected to ground.

The high pass integrator 700 integrates the input current Iin to produce an output voltage Vo according to the equation:

$$Vo \approx Iin*R/r* \int Iin \cdot dt$$

Where T is the time period of a negative pulse applied to a selected vertical rod.

The role of the high pass integrator 700 is to mitigate steady state leakage across the rods, unrelated to secondary electron emissions generated from ion beam impact at crossover points. Only current enabled by the applied pulse, that drives the secondary electrons across the node, will be integrated. It is appreciated that other suitable high pass integrators/filters can be employed to perform the above functions and still be in accordance with the present invention.

Figure 8:
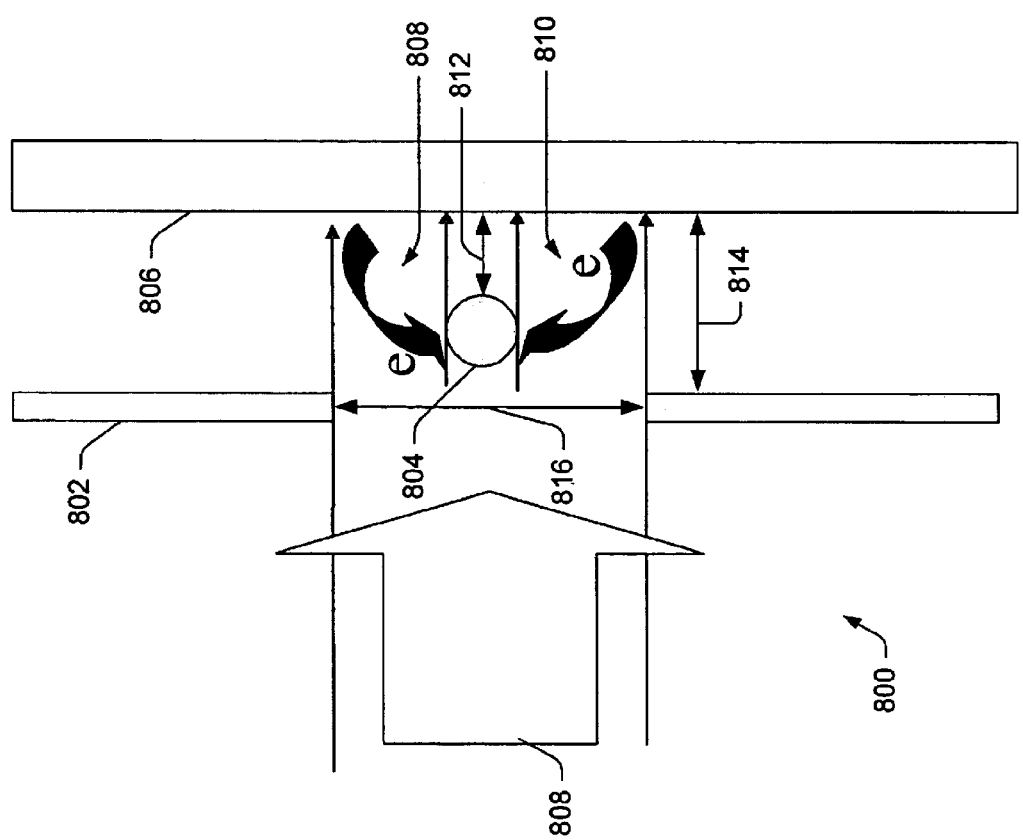
FIG. 8 is a cross sectional view of a portion of a detector in a first mode of operation in accordance with an aspect of the present invention.

FIG. 8 is a cross sectional view 800 of a portion of a detector in a first mode of operation in accordance with an aspect of the present invention. The view serves to illustrate basic modes of operation that can be employed by detectors of the present invention.

The view 800 includes a mask 802 with an aperture that permits a beamlet 808 of an incident ion beam to pass downstream. The aperture is typically rectangular shape and has a length 816 and a width (not shown). The length and width are selected to obtain the beamlet 808 of suitable shape and size. A first rod 804 is present as well as a second rod 806, which is after or downstream from the first rod as shown in FIG. 8. Additionally, the first rod 804 and the second rod 806 are positioned at 90 degree offset angles from each other so that they are orthogonal to each other. The second rod 806 is positioned a first distance 814 from the mask 802 and is parallel to a plane of the mask 802. The first rod 804 is positioned a second distance 812 upstream of the second rod 806 and is also parallel to a plane of the mask 802.

For the first mode of operation, a negative pulse is applied to the second rod 806. As a result, the beamlet 808 causes secondary electron emissions to be generated that flow from the second rod 806 to the first rod 804, as indicated at points 808 and 810. These secondary electron emissions can then be measured from the first rod 804 and utilized as described above.

Figure 9:
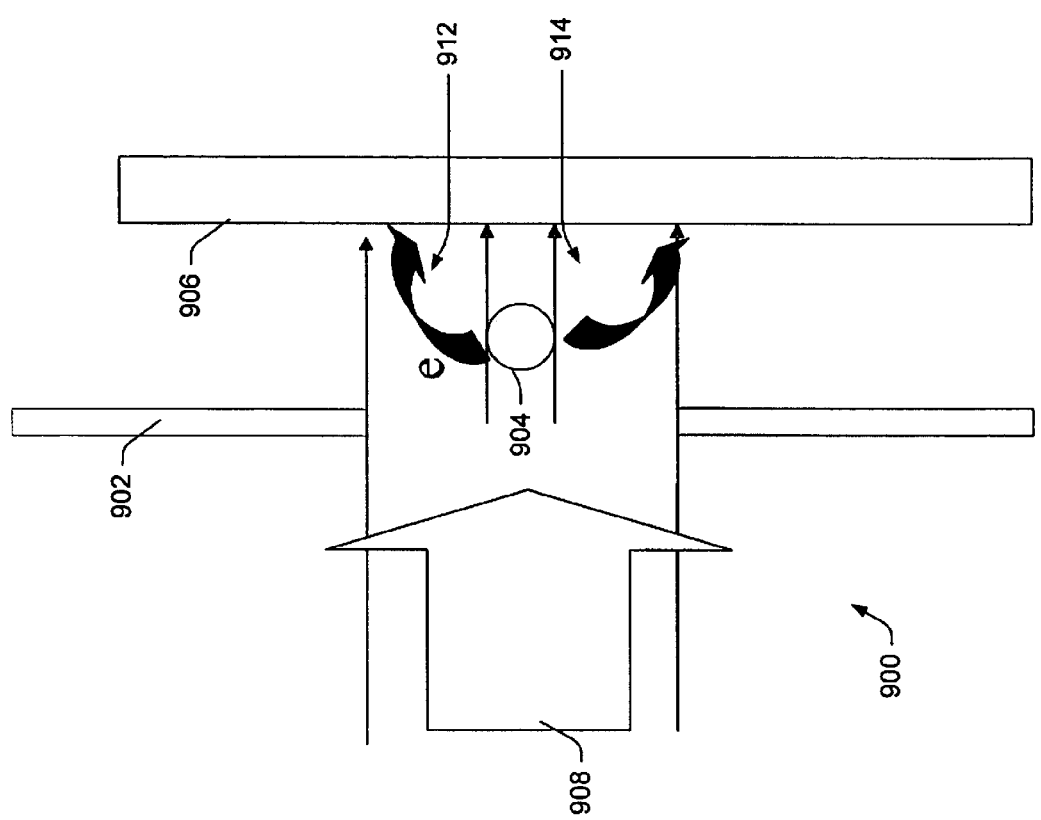
FIG. 9 is a cross sectional view of a portion of a detector in a second mode of operation in accordance with an aspect of the present invention.

FIG. 9 is a cross sectional view 900 of a portion of a detector in a second mode of operation in accordance with an aspect of the present invention. The view 900, like that of FIG. 8, serves to illustrate basic modes of operation that can be employed by detectors of the present invention.

The view 900 includes a mask 902 with an aperture that permits a beamlet 908 of an incident ion beam to pass downstream. A first rod 904 is present as well as a second rod 906, which is after or downstream from the first rod as shown in FIG. 9. Additionally, the first rod 904 and the second rod 906 are positioned at 90 degree offset angles from each other so that they are orthogonal to each other.

For the second mode of operation, the beamlet 908 causes secondary electron emissions to be generated that flow from the first rod 904 to the second rod 906, as indicated at points 912 and 914. These secondary electron emissions are driven by a negative voltage pulse applied to 904, onto the second rod 906 and utilized as described above.

FIGS. 8 and 9, described above illustrate two modes of operation that can be employed by detectors of the present invention. Furthermore, horizontal and vertical rods can be interchanged with respect to operation in accordance with the present invention and horizontal rods can be placed downstream after vertical rods instead of the reverse in accordance with the present invention.

Figure 10:
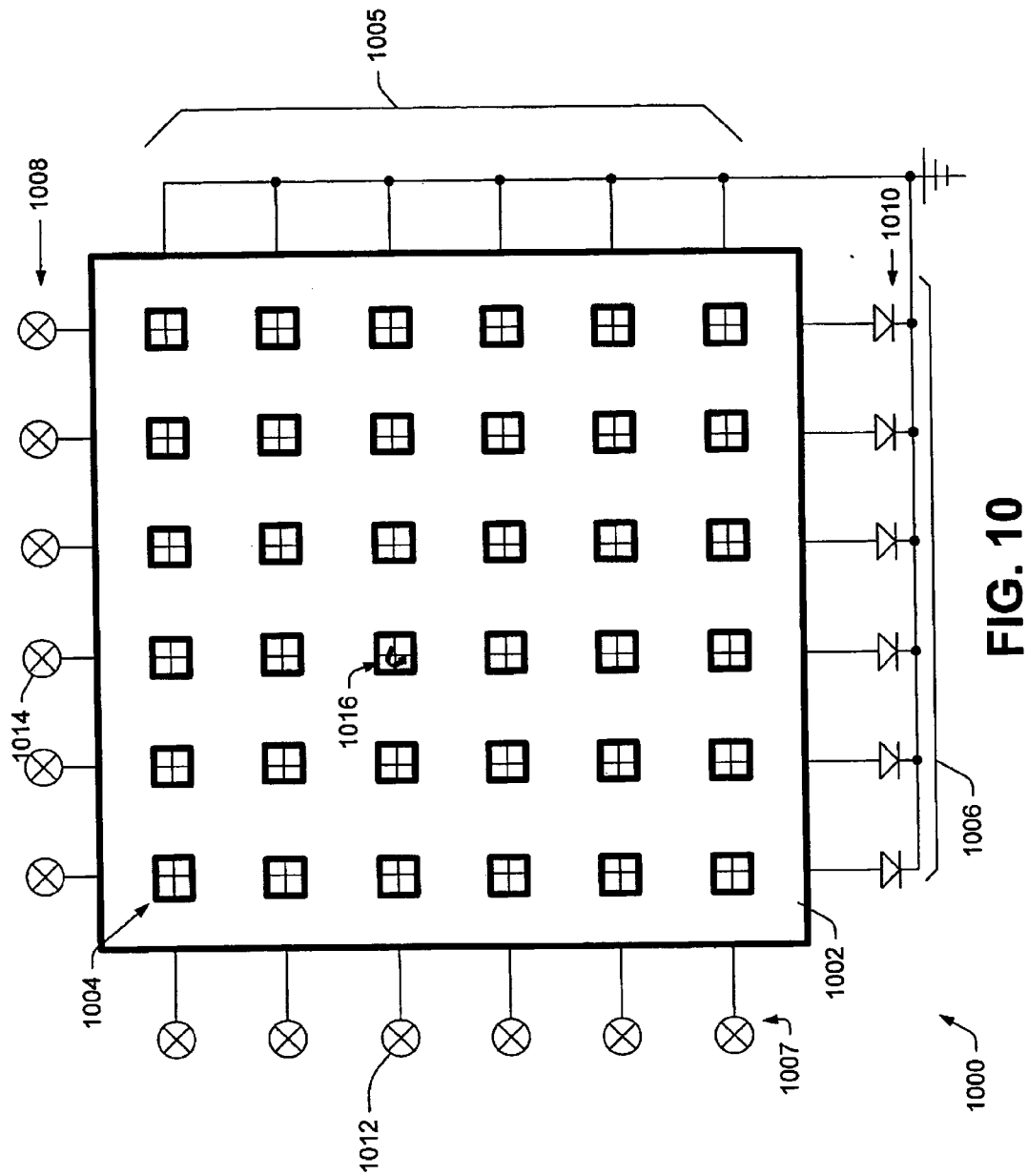
FIG. 10 is a plan view of a uniformity detector in accordance with an aspect of the present invention.

FIG. 10 is a plan view of a uniformity detector 1000 in accordance with an aspect of the present invention. The uniformity detector 1000 is shown with a mask 1002 overlaying the uniformity detector 1000. The view is presented for illustrative purposes and some portions of the detector are not present and/or described.

The mask 1002 has a number of rectangular shaped apertures 1004 that selectively permit beamlets of an incident ion beam to pass therethrough to crossover points below. The apertures 1004 have a selected shape that mitigates noise, interference from adjacent or nearby crossover points, and provides for a suitable signal at the respective crossover points.

Horizontal rods 1005 and vertical rods 1006 are present and positioned below the mask 1004 and downstream of an incident ion beam. The horizontal rods 1005 and the vertical rods 1006 are positioned at selected distances below the mask 1002 and are orthogonal to each other. Crossover points are defined at intersections of the horizontal rods 1005 and the vertical rods 1006. It is appreciated that the horizontal rods 1005 and the vertical rods 1006 can be replaced by dual rods or pairs of rods such as described with respect to FIG. 5 in accordance with the present invention.

Horizontal multiplexer switches 1007 are connected to the horizontal rods 1005 on one side. On the other, the horizontal rods 1005 are connected to ground. Vertical multiplexer switches 1008 are connected to the vertical rods 106 on one side. On the other side, the vertical rods 106 are connected to diodes 1010, which connect to ground and mitigate interference from other vertical rods 1006 and/or horizontal rods 1005.

During operation, a single horizontal multiplexer switch is turned on connecting an associated horizontal rod to charge output circuitry. Negative pulses are applied sequentially to the vertical rods 1006 turning on a current vertical multiplexer switch, applying a negative pulse, turning off the current multiplexer switch, and repeating with a next vertical multiplexer switch until charge measurements have been obtained for an associated horizontal row. The whole process again repeats for the next row. As an example, FIG. 10 shows a current vertical, multiplexer switch 1014 turned on as well as a current horizontal multiplexer switch 1012. As a result, a charge output measurement is obtained at crossover point 1016 by applying a negative pulse to the connected vertical rod.

Figure 11:
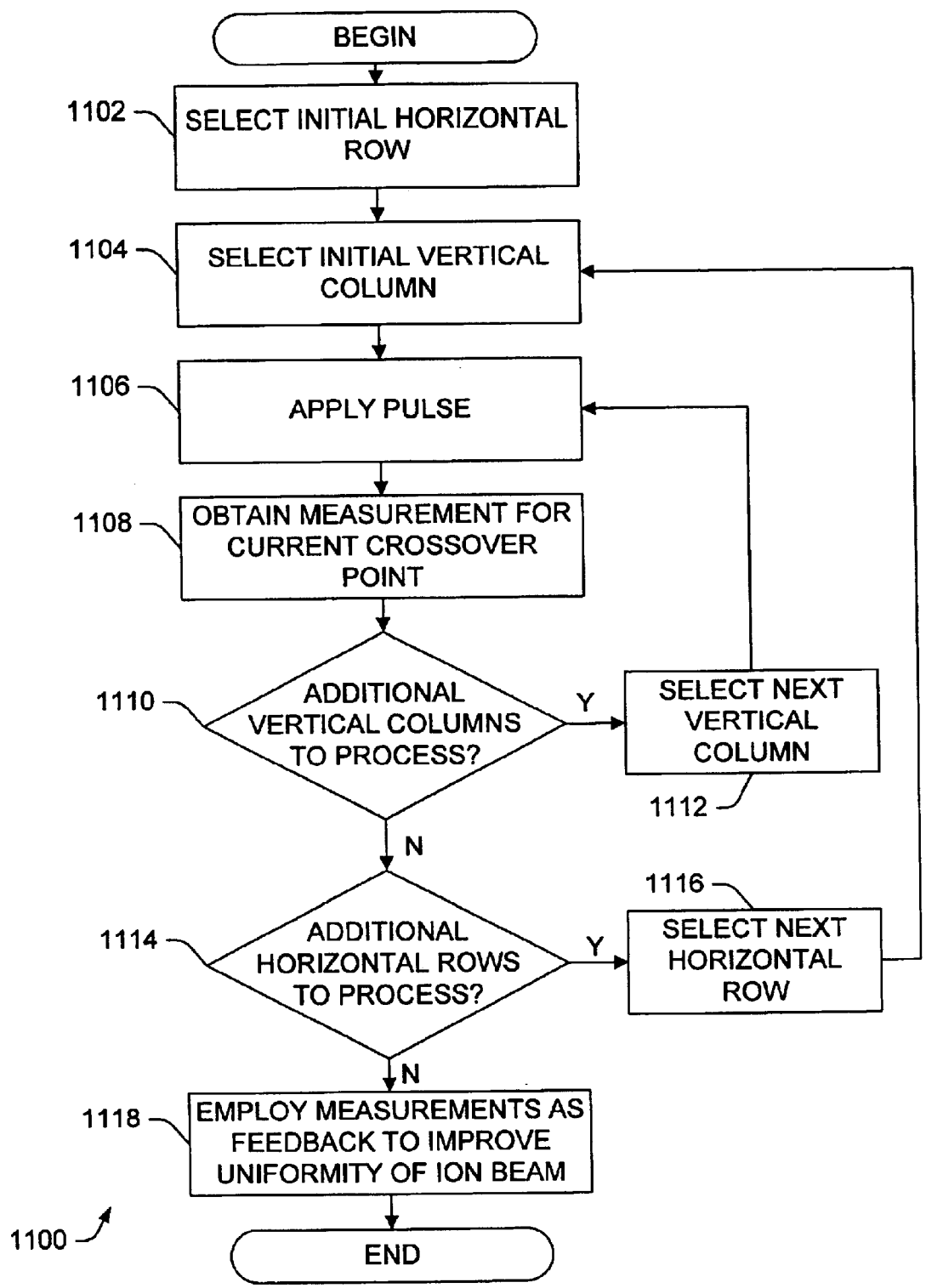
FIG. 11 is a flow diagram illustrating a method of obtaining charge output measurements for crossover points of a uniformity detector in accordance with an aspect of the present invention.
Figure 12:
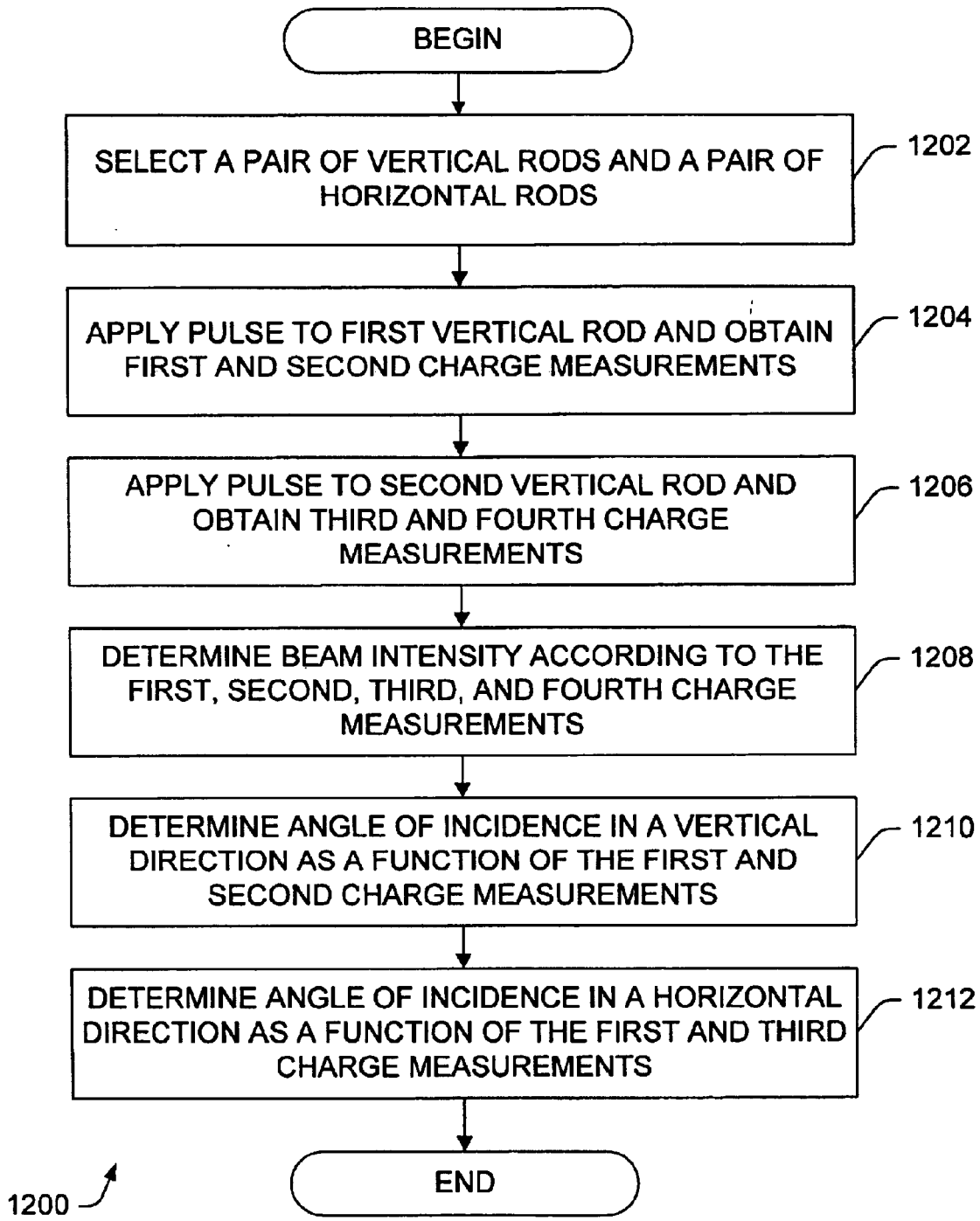
FIG. 12 is a flow diagram illustrating a method of obtaining an angle of incidence in multiple dimensions and intensity of an incident ion beam in accordance with an aspect of the present invention.

In view of the foregoing structural and functional features described supra, methodologies in accordance with various aspects of the present invention will be better appreciated with reference to the above figures and descriptions. While, for purposes of simplicity of explanation, the methodologies of FIGS. 11 and 12 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 11, a flow diagram illustrating a method 1100 of obtaining charge output measurements for crossover points of a uniformity detector in accordance with an aspect of the present invention. The detector comprises horizontal rows individually comprising a single horizontal rod or a pair of horizontal rods and vertical columns individually comprising a single vertical rod or a pair of vertical rods. The horizontal rows and vertical columns intersect at crossover points where charge output measurements are obtained.

The method 1100 begins at block 1102, wherein an initial horizontal row is selected. The horizontal rod(s) associated with the initial horizontal row are connected to a charge output circuit. At block 1104, an initial vertical column is selected. The vertical rod(s) associated with the initial vertical column are connected to input pulse circuitry.

A pulse is applied to the initial vertical column at block 1106 and can be positive or negative based on configuration and polarity to collect secondary electrons. The pulse can have a time period of about 1 mili-seconds and a voltage value of about 20 volts. A beamlet concurrently impacts associated horizontal and vertical rods causing secondary electron emissions to be generated. These emissions are converted and obtained as charge output measurement values for a current crossover point.

A determination is made as to whether additional vertical columns remain to be processes at block 1110. If so, a next adjacent vertical column is selected at block 1112 and the method returns to block 1106. Otherwise, a determination is made as to whether additional horizontal rows remain to be processed at block 1114. If so, a next horizontal row is selected at block 1116 and the method returns to block 1104 wherein processing of the vertical columns is performed for the next horizontal row. Otherwise, measurements for the crossover points have been obtained and the measurements are collected as a set and employed as feedback to improve uniformity of the ion beam with respect to one or more of the following, intensity, shape, and/or emittance at block 1118. The method can be repeated a desired number of times to obtain additional sets of charge output values.

The charge output values obtained by the method can be employed to characterize an incident ion beam with respect to size, shape, intensity, and emittance. It is appreciated that processing of the method can be relatively fast due to the simplicity of the design, such as shown in FIGS. 3 and 5. For example, a 30 row by 30 column detector can obtain charge measurements at all crossover points (900 crossover points) in a few milliseconds.

FIG. 12 is a method 1200 of obtaining an angle of incidence in multiple dimensions and intensity of an incident ion beam in accordance with an aspect of the present invention. The method 1200 obtains these characteristics for a single crossover point of a dual rod uniformity detector.

The method begins at block 1202, wherein a pair of vertical rods and a pair of horizontal rods are selected. As described previously, the vertical rods are connected to pulse generation circuitry and the horizontal rods are connected to charge output circuitry. Typically, selecting means that multiplexer switches for associated rods are turned ON.

A pulse (e.g., a negative pulse) is applied to a first vertical rod of the pair of vertical rods and first and second charge measurements are obtained from the pair of horizontal rods at block 1204. A pulse is applied to a second vertical rod of the pair of vertical rods and third and fourth charge measurements are obtained from the pair of horizontal rods at block 1206. A beam intensity is determined for the current crossover point according to the first, second, third, and fourth charge measurements at block 1208. Continuing, an angle of incidence in a vertical dimension is determined at block 1210 as a function of the first and second charge measurements. These measurements define a ratio that indicates the angle of incidence. An angle of incidence is a horizontal dimension is then determined at block 1212 as a function of the first and third charge measurements. Alternately or in addition to, the second and fourth charge measurements can be employed to determine the angle of incidence in the horizontal dimension.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A beam uniformity measurement system comprising:
   a number of vertical rods extending in a first direction that selectively receive a pulse signal via a vertical rod selection mechanism;
   a number of horizontal rods extending in a second direction that is non-parallel to the first direction and upstream of the number of vertical rods and biased to a voltage above the negative pulse signal, wherein a number of crossover measurement points are defined at intersections of the number of horizontal rods and the number of vertical rods; and
   charge output circuitry that selectively scans the number of horizontal rods via a horizontal rod selection mechanism to obtain a signal corresponding to secondary electron emissions from the number of horizontal rods in response to an incident ion beam.

2. The system of claim 1, further comprising a mask upstream of the horizontal rods that includes a number of apertures that selectively obtain beamlets from the incident ion beam that pass to the underlying crossover measurement points.

3. The system of claim 2, wherein the apertures have a rectangular shape that is a function of desired beamlet properties including noise and signal strength.

4. The system of claim 1, wherein the charge output circuitry determines beam intensity at the number of crossover measurement points according to the received secondary electron emissions.

5. The system of claim 1, wherein the charge output circuitry determines charge output values according to the received secondary electron emissions.

6. The system of claim 1, wherein the charge output circuitry determines beam shape according to the received secondary electron emissions.

7. A beam uniformity measurement system comprising:
   a number of pairs of vertical rods that selectively receive a positive pulse signal;
   a number of pairs of horizontal rods upstream of the number of pairs of vertical rods and biased to a voltage above the negative pulse signal, wherein the number of pairs of horizontal rods are substantially orthogonal to the number of pairs of vertical rods and a number of crossover measurement points are defined at intersections of the number of pairs of horizontal rods and the number of pairs of vertical rods; and
   charge output circuitry that selectively receives secondary electron emissions from the number of pairs of horizontal rods in response to an incident ion beam.

8. The system of claim 7, wherein the charge output circuitry determines beam intensity at the number of crossover measurement points according to the received secondary electron emissions.

9. The system of claim 7, wherein the charge output circuitry determines angle of incidence measurements in vertical and horizontal dimensions at the number of crossover measurement points according to the received secondary electron emissions.

10. The system of claim 7, wherein the number of pairs of horizontal rods is equal to 30, the number of pairs of vertical rods is equal to 30, and the number of crossover measurement points is equal to 900.

11. A method for obtaining crossover point measurements comprising:
    selecting an initial horizontal row of a number of horizontal rows;
    selecting an initial vertical column of a number of vertical columns;
    applying a pulse to the selected column;
    obtaining a current crossover point measurement;
    processing additional vertical columns by iteratively selecting a next vertical column, applying the pulse, and obtaining additional crossover point measurements; and
    processing additional horizontal rows by iteratively selecting a next horizontal row and processing the number of vertical columns to obtain additional row crossover point measurements.

12. The method of claim 11, wherein the number of horizontal rows respectively comprise pairs of horizontal rods and the number of vertical columns respectively comprise pairs of vertical rods.

13. The method of claim 11, wherein the number of horizontal rows respectively comprise single horizontal rods and the number of vertical columns respectively comprise single vertical rods.

14. The method of claim 11, further comprising determining beam intensity for an incident ion beam according to the obtained crossover point measurements.

15. The method of claim 11, further comprising determining beam emittance for an incident ion beam according to the obtained crossover point measurements.

16. A method of operating a detector comprising:

selecting a pair of vertical rods and a pair of horizontal rods, wherein the vertical rods are positioned orthogonal to the horizontal rods and the pair of vertical rods and the pair of horizontal rods receive an incident ion beam;

applying a negative pulse to a first vertical rod of the pair of vertical rods and obtaining first and second charge measurements from the pair of horizontal rods; and applying a negative pulse to a second vertical rod of the pair of vertical rods and obtaining third and fourth charge measurements from the pair of horizontal rods.

17. The method of claim 16, further comprising determining beam intensity according to the first, second, third, and fourth charge measurements.

18. The method of claim 16, further comprising determining angle of incidence measurements in a vertical direction as a function of the first and second charge measurements.

19. The method of claim 16, further comprising determining angle of incidence measurements in a horizontal direction as a function of the first and third charge measurements.

20. The method of claim 16, further comprising determining a beam shape as a function of the first and second charge measurements.

* * * * *